United States Patent
Shiu et al.

(10) Patent No.: US 8,900,913 B2
(45) Date of Patent: Dec. 2, 2014

(54) CHIP PACKAGE AND METHOD FOR FORMING THE SAME

(76) Inventors: Chuan-Jin Shiu, Zhongli (TW);
Po-Shen Lin, New Taipei (TW);
Shen-Yuan Mao, Zhongli (TW);
Cheng-Chi Peng, Zhongli (TW)

( * ) Notice: Subject to any disclaimer, the term of this patent is extended or adjusted under 35 U.S.C. 154(b) by 0 days.

(21) Appl. No.: 13/588,898

(22) Filed: Aug. 17, 2012

(65) Prior Publication Data
US 2013/0045549 A1 Feb. 21, 2013

Related U.S. Application Data

(60) Provisional application No. 61/525,255, filed on Aug. 19, 2011.

(51) Int. Cl.
*H01L 33/00* (2010.01)
*H01L 21/00* (2006.01)
*H01L 27/146* (2006.01)

(52) U.S. Cl.
CPC ... *H01L 27/14618* (2013.01); *H01L 2933/0025* (2013.01)
USPC ............ 438/72; 438/29; 257/96; 257/99; 257/E31.122; 257/E33.072

(58) Field of Classification Search
USPC ............ 257/435, 437, E21.029, E31.122; 438/29, 69, 72, 697, 781
See application file for complete search history.

(56) References Cited

U.S. PATENT DOCUMENTS

| | | | |
|---|---|---|---|
| 2003/0218250 A1* | 11/2003 | Kung et al. | 257/737 |
| 2004/0147051 A1* | 7/2004 | Wada | 438/22 |
| 2008/0099900 A1* | 5/2008 | Oganesian et al. | 257/678 |
| 2008/0160781 A1* | 7/2008 | Kyouda et al. | 438/758 |
| 2009/0256260 A1* | 10/2009 | Nakamura | 257/758 |
| 2010/0116201 A1* | 5/2010 | Oladeji | 118/428 |
| 2010/0117181 A1* | 5/2010 | Kim et al. | 257/432 |
| 2012/0243099 A1* | 9/2012 | Kaneko | 359/611 |

FOREIGN PATENT DOCUMENTS

WO  WO 2011071133 A1 *  6/2011

* cited by examiner

*Primary Examiner* — Daniel Luke
*Assistant Examiner* — Khaja Ahmad
(74) *Attorney, Agent, or Firm* — Liu & Liu

(57) ABSTRACT

An embodiment of the invention provides a method for forming a chip package which includes: providing a substrate having a first surface and a second surface, wherein at least one optoelectronic device is formed in the substrate; forming an insulating layer on the substrate; forming a conducting layer on the insulating layer on the substrate, wherein the conducting layer is electrically connected to the at least one optoelectronic device; and spraying a solution of light shielding material on the second surface of the substrate to form a light shielding layer on the second surface of the substrate.

19 Claims, 9 Drawing Sheets

CHIP PACKAGE AND METHOD FOR FORMING THE SAME

CROSS REFERENCE TO RELATED APPLICATIONS

This Application claims the benefit of U.S. Provisional Application No. 61/525,255, filed on Aug. 19, 2011, the entirety of which is incorporated by reference herein.

BACKGROUND OF THE INVENTION

1. Field of the Invention

The invention relates to a chip package and fabrication method thereof, and in particular relates to an optoelectronic device chip package and fabrication method thereof.

2. Description of the Related Art

Optical-electronic devices such as light sensing devices or light emitting devices play an important role for image capture or lighting applications. These optical-electronic devices are widely used in electronic products such as digital cameras, digital video recorders, mobile phones, solar cells, screens, illumination elements, and so on.

Along with advancements in technological development, requirements for light sensing precision of light sensing devices or light emitting precision of light emitting devices have increased.

BRIEF SUMMARY OF THE INVENTION

An embodiment of the invention provides a method for forming a chip package which includes: providing a substrate having a first surface and a second surface, wherein at least one optoelectronic device is formed in the substrate; forming an insulating layer on the substrate; forming a conducting layer on the insulating layer on the substrate, wherein the conducting layer is electrically connected to the at least one optoelectronic device; and spraying a solution of light shielding material on the second surface of the substrate to form a light shielding layer on the second surface of the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
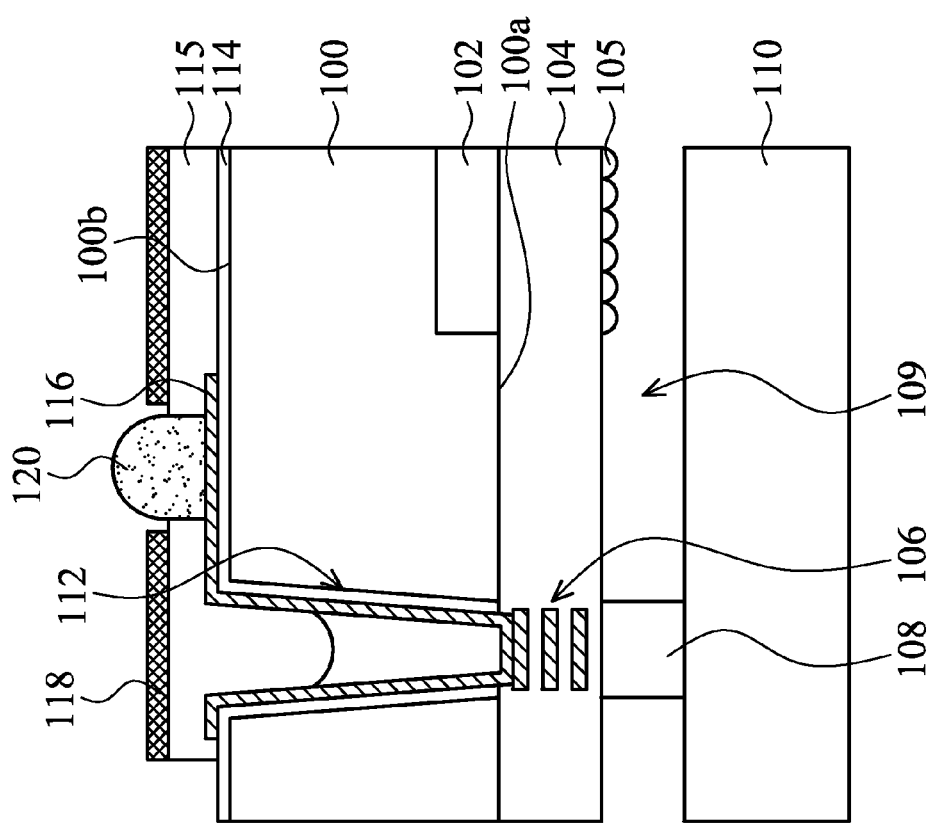
FIGS. 1A and 1B are a cross-sectional view and an enlarged view, respectively, showing a chip package known by the inventor.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package an optoelectronic device such as light sensing devices or light emitting devices. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may only be slightly larger than the size of the packaged chip. For example, the size of the chip package is not larger than 120% of the size of the packaged chip.

Figure 1B:
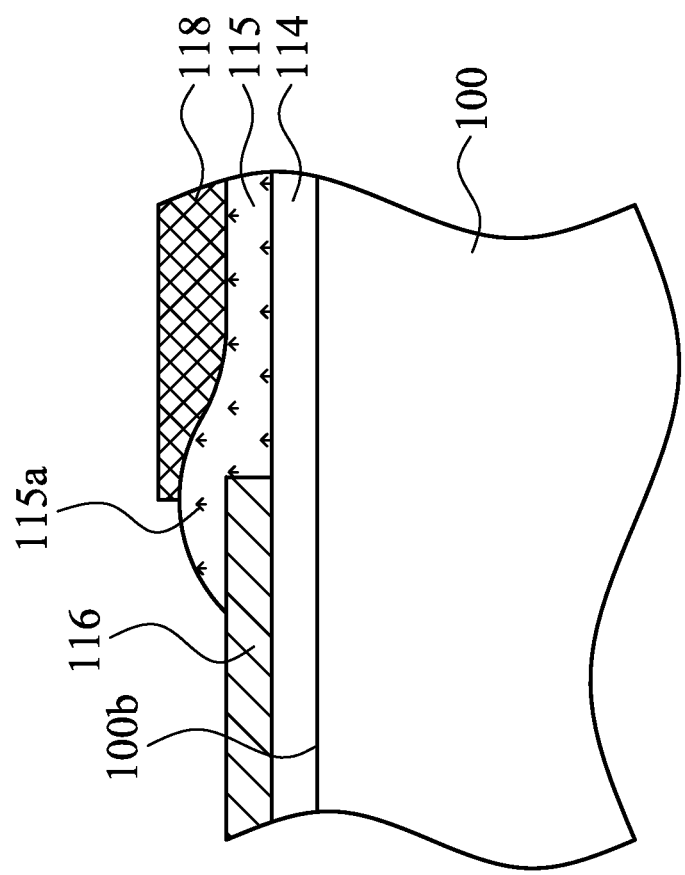

FIGS. 1A and 1B are a cross-sectional view and an enlarged view, respectively, showing a chip package known by the inventor. It should be appreciated that the chip package shown in FIGS. 1A and 1B is merely used to illustrate problems found by the inventor of the application, which is not a commonly known prior art for one skilled in the art.

As shown in FIG. 1A, the chip package may include a substrate 100. An optoelectronic device 102 is formed in the substrate 100. The optoelectronic device 102 may be electrically connected to a conducting pad structure 106 disposed on a surface 100a of the substrate 100 through a wire layer (not shown). The conducting pad structure 106 is disposed in, for example, an insulating layer 104 on the surface 100a of the substrate 100. A substrate 110 may also be disposed on the surface 100a of the substrate 100. The substrate 110 and the substrate 100 may be separated from each other by a spacer layer 108. The spacer layer 108, the substrate 100, and the substrate 110 may together surround a cavity 109 on the optoelectronic device 102. A lens 105 may be disposed in the cavity 109 on the optoelectronic device 102. A through-hole 112 may be formed in the substrate 100 which extends from a surface 100b towards the surface 100a, wherein the through-hole 112 may expose the conducting pad structure 106. An insulating layer 114 and a conducting layer 106 may be formed on a sidewall of the through-hole 112. The insulating layer 114 and the conducting layer 116 may extend onto the surface 100b of the substrate 100. A protection layer 115 and a conducting bump 120 may be disposed on the surface 100b of the substrate 100. The protection layer 115 may be a solder resist layer such as green paint. The conducting bump 120 may be electrically connected to the conducting pad structure 106 through the conducting layer 116. A light shielding layer 118 may be disposed on the protection layer 115 to prevent outside light from entering the substrate 100 to negatively affect the operation of the optoelectronic device 102.

However, the light shielding layer 118 formed on the protection layer 115 may be negatively affected by the protection layer 115 thereunder such that cracks or voids are formed. The existence of the cracks or voids may result in outside light penetrating the light shielding layer 118 to enter the substrate 100 and negatively affecting the operation of the optoelectronic device 102.

FIG. 1B is an enlarged view partially showing the chip package in FIG. 1A. Because the protection layer 115 usually has high stress, cracks are easily generated such that cracks are also easily formed in the light shielding layer 118 thereon. Further, as shown in FIG. 1B, because the light shielding layer 118 formed on the conducting layer 116 is usually blanketly formed on the protection layer 115, due to the influence of the profile of the material layer thereunder, the light shielding layer 118 located on the conducting layer 116 has a smaller thickness. Thus, cracks or voids are more easily formed. In addition, fillers 115a are often filled in the protection layer 115. The filler 115a may cause the light shielding layer 118 to break more easily, which leads to leakage of light, especially the portion of the light shielding layer 118 having a thinner thickness. In addition, the solution used for forming the light shielding layer 118 usually has relatively less viscosity. Thus, the light shielding layer 118 formed by using a spin coating process easily has a problem of non-uniform thickness. The light shielding layer 118 having a non-uniform thickness is easily affected by the protection layer 115 to generate cracks or voids allowing light to pass therethrough. In order to resolve the problem of light leaking to the light shielding layer 118, the embodiments of the invention provide a novel chip package and the fabrication method thereof which are described in the following.

FIGS. 2A-2E are cross-sectional views showing the steps of forming a chip package according to an embodiment of the present invention, wherein same or similar reference numbers are used to designate same or similar elements. The chip package according to the embodiment of the invention may be formed by using, for example, (but is not limited to) a wafer-level packaging process to reduce fabrication cost and time and ensure packaging quality.

Figure 2A:
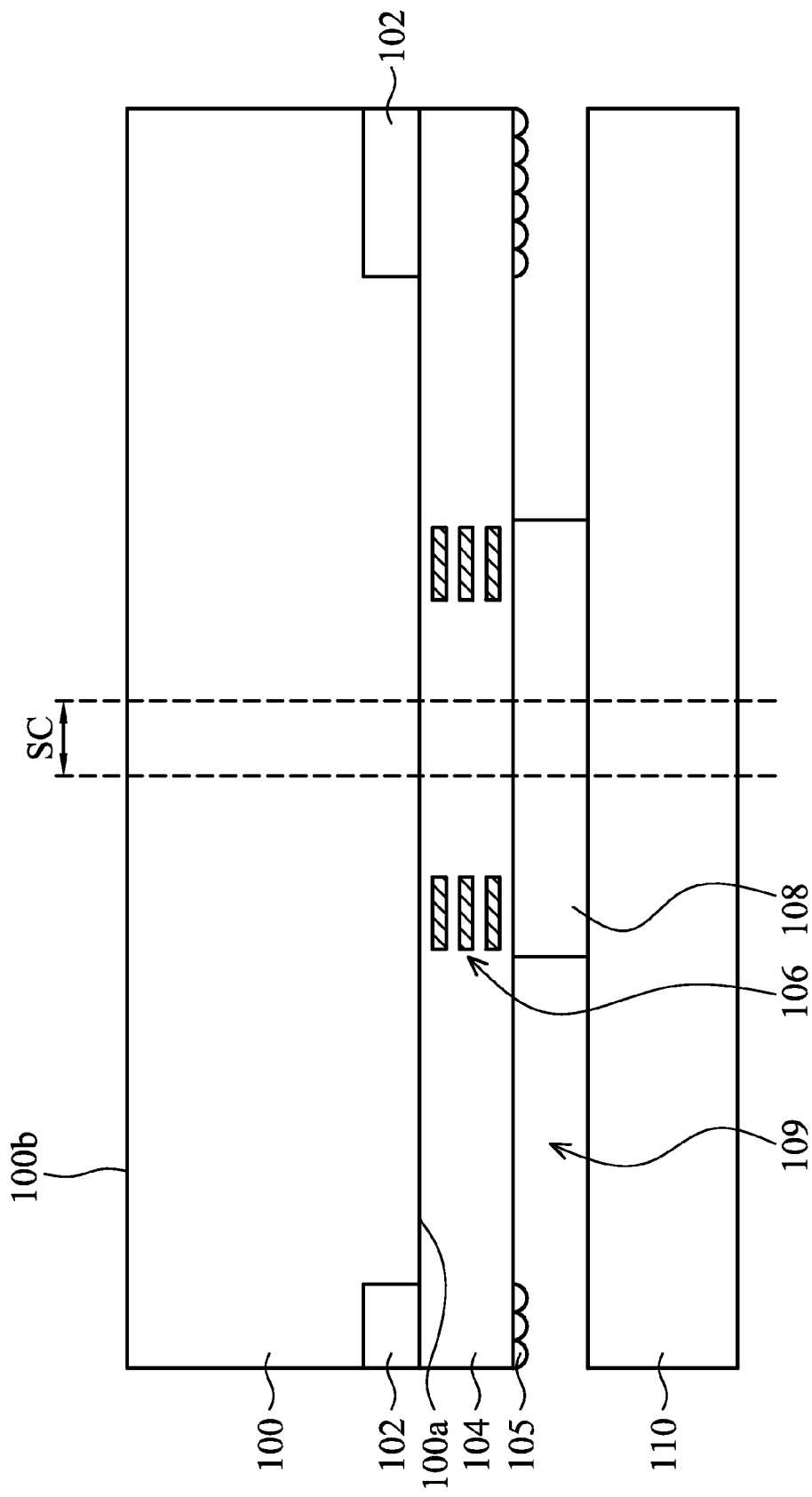
FIGS. 2A-2E are cross-sectional views showing the steps of forming a chip package according to an embodiment of the present invention.

As shown in FIG. 2A, a substrate 100 is provided, which is, for example, a semiconductor substrate or a ceramic substrate. In one embodiment, the substrate 100 includes a semiconductor material, which is, for example, a semiconductor wafer (such as a silicon wafer). A wafer-level packaging process may be performed to the substrate 100 to reduce the fabrication time and cost. The substrate 100 has surfaces 100a and 100b. The surfaces 100a and 100b are, for example, opposite to each other. The substrate 100 may have a plurality of predetermined scribe lines SC which define the substrate 100 into a plurality of regions. After a packaging process and a dicing process are subsequently performed, each of the regions is packaged in a chip package. That is, the substrate after dicing may be the chip packaged in the formed chip package.

As shown in FIG. 2A, in one embodiment, optoelectronic devices 102 are formed in the substrate 100. In one embodiment, each of the regions defined by the predetermined scribe lines has at least one optoelectronic device 102 formed therein. The optoelectronic device 102 may include (but is not limited to) an image sensor device or a light emitting device. In one embodiment, the image sensor device is, for example, a CMOS image sensor (CIS) device or a charge-coupled sensing device (CCD). In one embodiment, the light emitting device is, for example, a light emitting diode device.

The optoelectronic device 102 may be electrically connected to, for example, a conducting pad structure 106 in an insulating layer 104 formed on the surface 100a and may be connected to another conducting route through the conducting pad structure 106. The conducting pad structure 106 may be a plurality of conducting pads stacked with each other, a single conducting pad, or a conducting pad structure constructed by at least a conducting pad and at least an interconnection structure.

In one embodiment, a lens 105 may be disposed on the optoelectronic device 102. For example, the lens 105 may be disposed on the insulating layer 104 to substantially align with the optoelectronic device 102. The lens 105 may be used to assist in the entering and/or exiting of light. The lens 105 may be, for example, a micro-lens array.

Then, a substrate 110 may be optionally disposed on the surface 100a of the substrate 100. The substrate 110 is, for example, a transparent substrate such as a glass substrate, quartz substrate, transparent polymer substrate, or combinations thereof. In one embodiment, the size and the shape of the substrate 110 may be similar to those of the substrate 100. For example, in the embodiment that the substrate 100 is a semiconductor wafer, the size and the shape of the substrate 110 may be substantially the same as the substrate 100, and the substrate 110 may be circular.

In one embodiment, the substrate 100 and the substrate 110 may be optionally separated from each other by a spacer layer 108. The spacer layer 108 may be formed in advance on the substrate 110 or the substrate 100. The spacer layer 108 may be, for example, an insulating material such as a polymer material, ceramic material, or combinations thereof. In one embodiment, the spacer layer 108, the substrate 100, and the substrate 110 may together surround a cavity 109 on the optoelectronic device 102. The lens 105 may be located in the cavity 109 without contacting with the substrate 110.

Figure 2B:
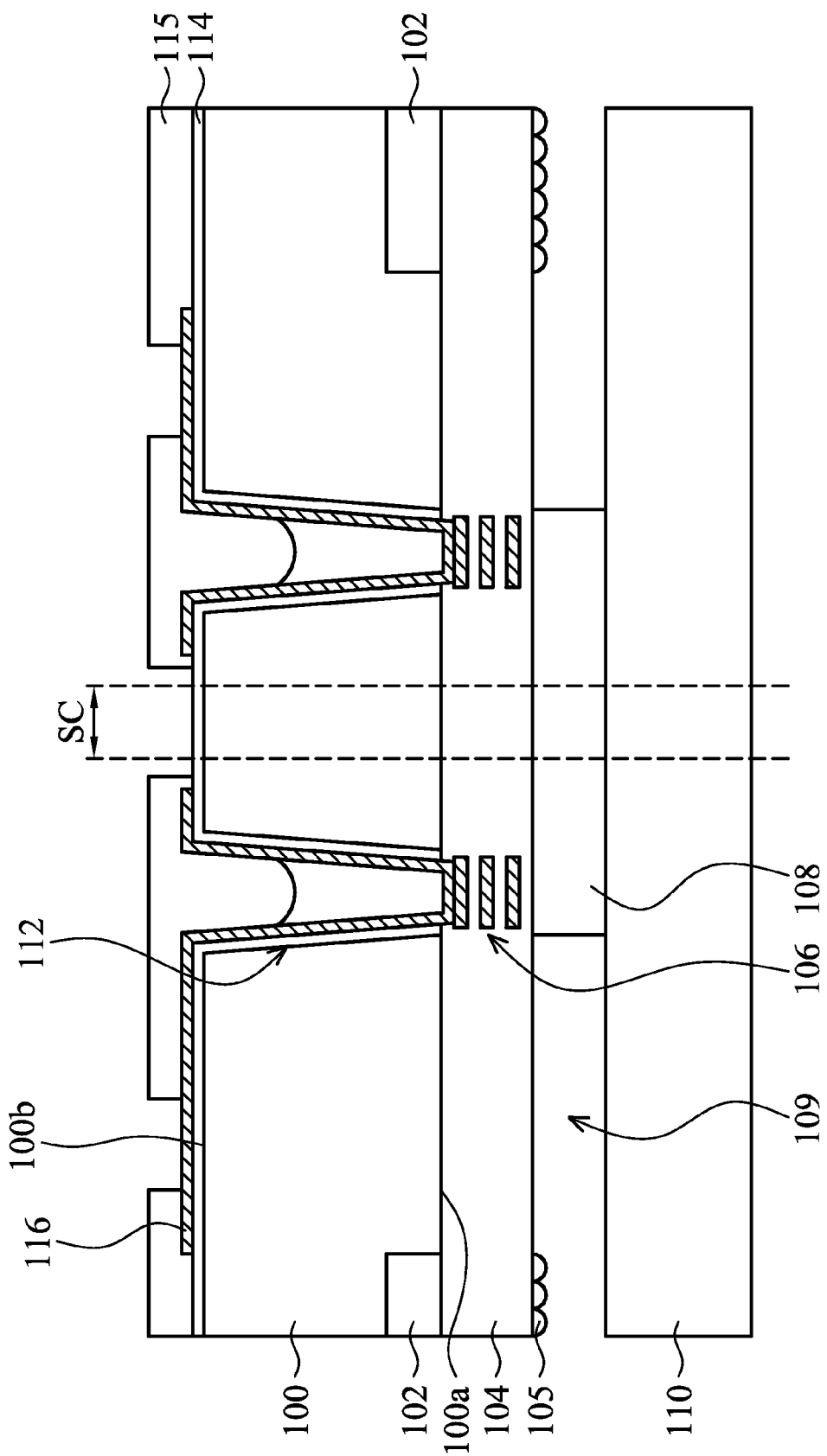

As shown in FIG. 2B, the substrate 100 may be optionally thinned to facilitate subsequent process steps. For example, the substrate 110 may be used as a support, and a thinning process may be performed from the surface 100b of the substrate 100 to thin down the substrate 100 to an appropriate thickness. The thinning process may be, for example, a mechanical grinding process, chemical mechanical polishing process, etching process, or combinations thereof.

In one embodiment, a conducting layer electrically connected to the conducting pad structure 106 may then be formed on the substrate 100. In one embodiment, a through substrate conducting structure electrically connected to the conducting pad structure 106 may be formed in the substrate 100. In one embodiment, by using, for example, a photolithography process and an etching process, a portion of the substrate 100 may be removed from the surface 100b of the substrate 100 to form a through-hole 112 extending towards the conducting pad structure 106. In one embodiment, a plurality of through-holes 112 may be simultaneously formed, wherein each of the through-holes 112 may expose the corresponding conducting pad structure 106 thereunder, respectively. That is, in the embodiment where a wafer-level packaging process is applied, a plurality of through-holes 112 in the chip package may be formed in the same patterning process. In one embodiment, a portion of the insulating layer 104 may be removed to expose the conducting pad structure 106. Then, an insulating layer 114 may be formed on the surface 100b of the substrate 100. The insulating layer 114 may be, for example, silicon oxide, silicon nitride, silicon oxynitride, polymer material, or combinations thereof. The insulating layer 114 may be formed by using, for example, a vapor deposition process, applying process, or thermal oxidation process. The insulating layer 114 may extend into the through-hole 112 to be located on the sidewall and the bottom of the through-hole 112. Then, by using a photolithography process and an etching process, the insulating layer 114 at the bottom of the through-hole 112 may be removed such that a portion of the conducting pad structure 106 is exposed.

Then, a conducting layer 116 is formed on the surface 100b of the substrate 100. The conducting layer 116 may extend into the through-hole 112 to electrically contact with the conducting pad structure 106 exposed by the through-hole 112. The material of the conducting layer 116 is, for example, (but is not limited to) a metal material such as copper, aluminum, gold, nickel, tungsten, or combinations thereof. The conducting layer 116 may be formed by using, for example, a physical vapor deposition process, chemical vapor deposition process, electroplating process, electroless plating process, or combinations thereof. In one embodiment, the conducting layer 116 may be patterned according to requirements by a photolithography process and an etching process.

Then, a protection layer 115 may be optionally formed on the conducting layer 116. The protection layer 115 may be a solder resist material such as green paint. In one embodiment, the protection layer 115 may be patterned by an exposure process and a development process to form openings exposing the conducting layer 116. In one embodiment, the solution (such as green paint) used for forming the protection layer 115 has high viscosity, thereby partially filling the through-hole 112, such that a bottom surface of the protection layer 115 does not reach a portion of the conducting layer 116 which overlies a bottom of the through-hole 112, as shown in FIG. 2D (depicted in FIG. 2D as a space between the protection layer 115 and the conducting layer 116 in the through-hole 112). Thus, the protection layer 115 formed on the conducting layer 116 and the insulating layer 114 may have an uneven upper surface.

Figure 2C:
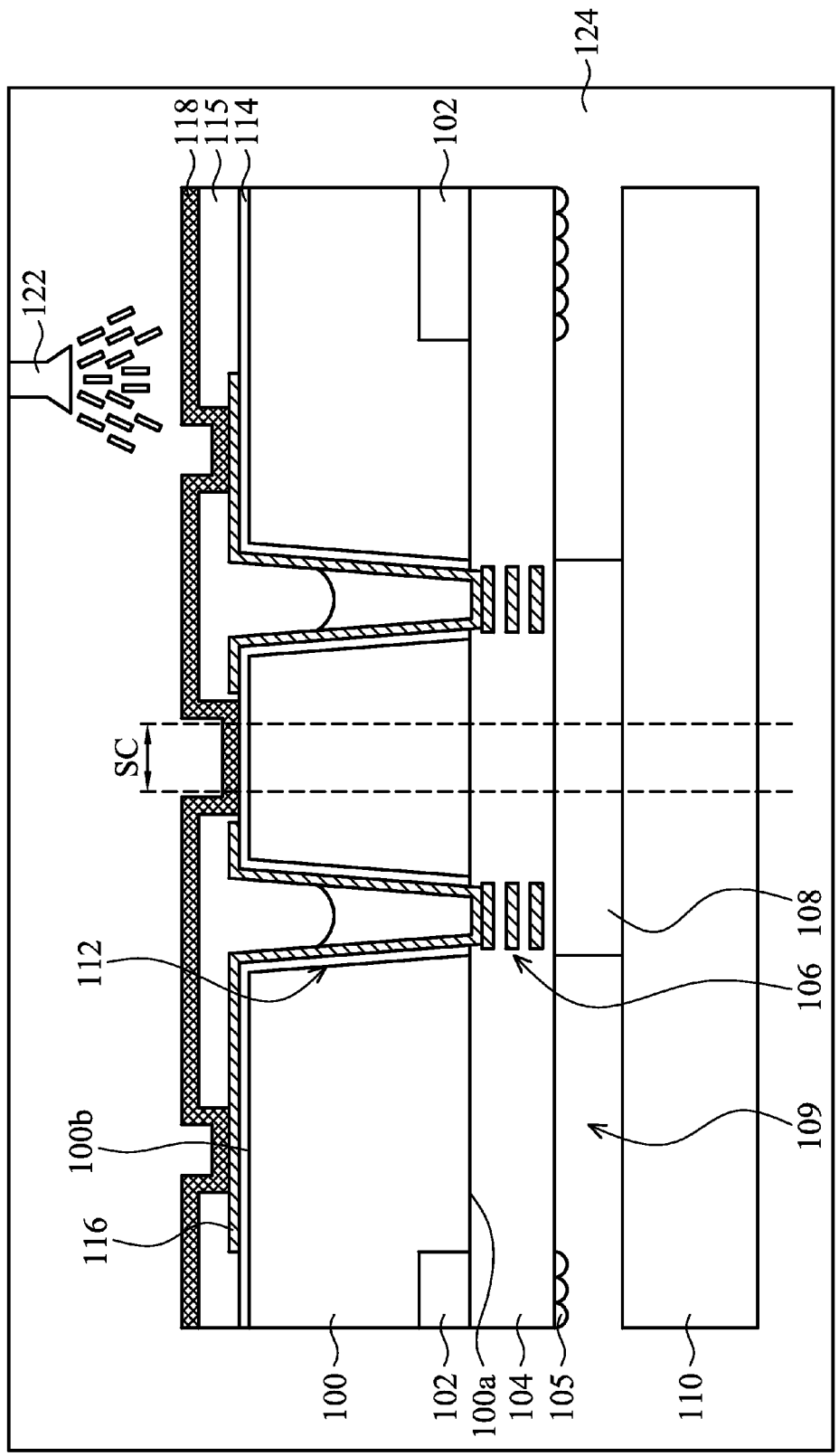
Figure 2D:
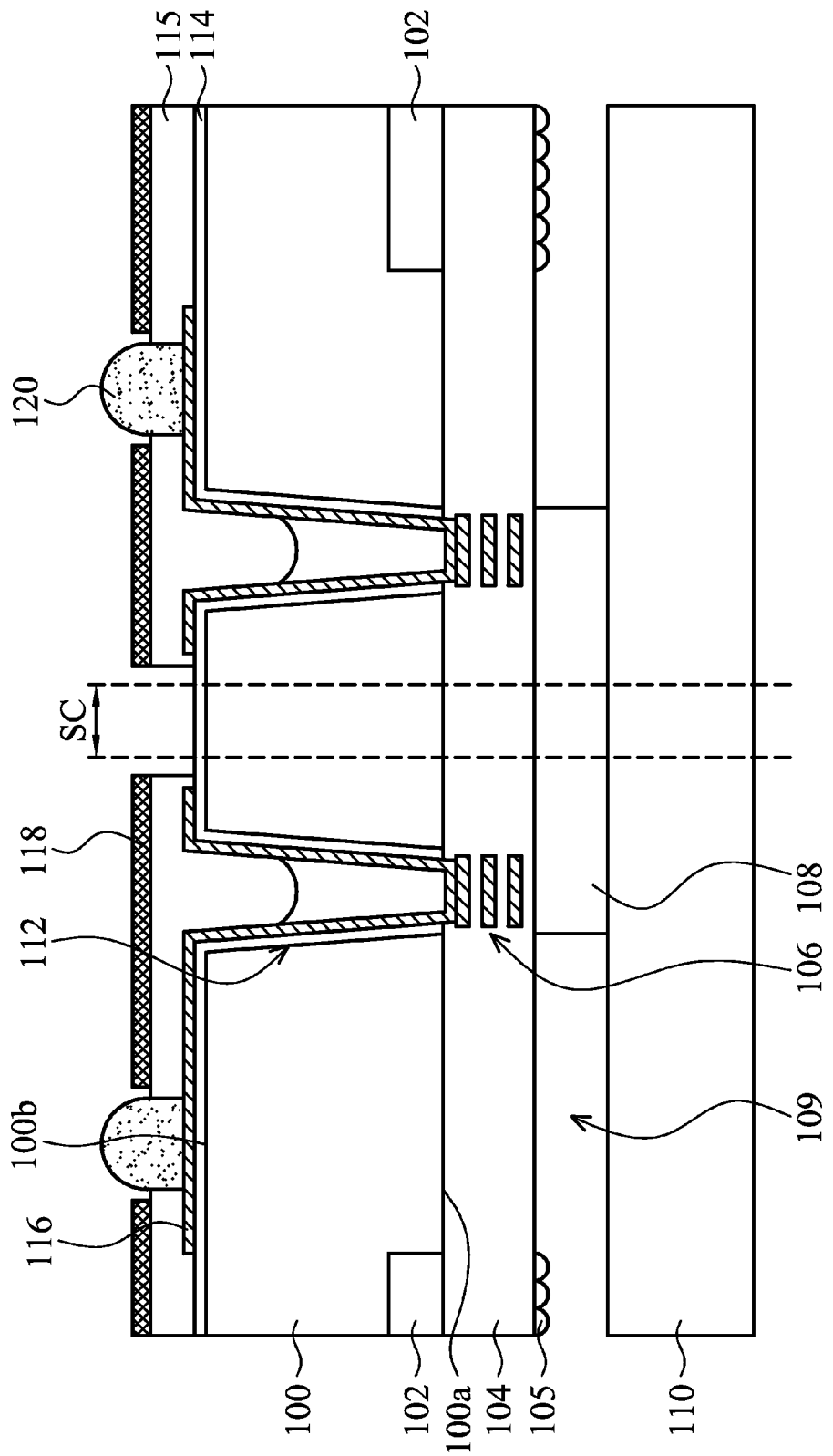

As shown in FIG. 2C, after the conducting layer 116 and the protection layer 105 are formed, a light shielding layer 118 is formed on the surface 100b of the substrate 100 and the conducting layer 116. In one embodiment, a spraying process is used to form the light shielding layer 118 on the surface 100b of the substrate 100 and the conducting layer 116. In one embodiment, a solution (such as a polymer solution) used for forming the light shielding layer 118 may be sprayed on the surface 100b of the substrate 100 and the conducting layer 116 through a nozzle 122 to form a light shielding material layer. During this time, the solvent in the light shielding material solution may be at least partially evaporated such that the viscosity of the light shielding material solution may be accordingly increased when the light shielding material solution reaches the conducting layer 116 or the protection layer 115. The light shielding material solution having higher viscosity may be substantially conformal with the profile of the conducting layer 116 or the protection layer 115 and adhere onto the contacted surface. Thus, the formed light shielding material layer may be substantially conformal with the profile of the material layer thereunder and may have substantially a same thickness. Because the thickness of the light shielding material layer formed by the spraying process is substantially uniform and relatively is not affected by the profile of the material layer thereunder, the light shielding material layer is not easily affected by the protection layer 115 and broken.

In one embodiment, through the control of the flow of the light shielding material solution sprayed from the nozzle 122, the thickness of the light shielding material layer may be adjusted. In one embodiment, a gas flow may be introduced into a chamber 124 where the light shielding material solution is sprayed to enhance the evaporation of the solvent in the light shielding material solution. For example, in one embodiment, nitrogen gas flow may be introduced into the chamber 124. The introduced nitrogen gas may increase the evaporation speed of the solvent in the light shielding material solution such that the formed light shielding material layer is more conformal and has a more uniform thickness. The amount and the speed of the introduced gas may be adjusted according to requirements. In addition, the angle of the nozzle 122 may also be adjusted to facilitate the spraying of the light shielding material solution. In one embodiment, a plurality of spraying processes of the light shielding material solution may be performed to the substrate 100.

Then, the light shielding material layer may be patterned according to requirements to form the light shielding layer 118, as shown in FIG. 2D. For example, the light shielding material layer may be a material layer capable of being patterned, such as a photoresist layer (ex. a black photoresist layer). Thus, an exposure process and a development process may be performed to the light shielding material layer to form the light shielding layer 118 having a desired pattern. In one embodiment, the light shielding layer 118 may be a negative type photoresist layer. In one embodiment, the light shielding layer 118 may have a light shielding rate of more than about 80%. For example, the light shielding rate of the light shielding layer 118 may range from between 80% and 99.9%, 85% and 99.5%, or 90% and 99%. Usually, the light shielding rate of the light shielding layer 118 determines the light shielding degree of the visible light and/or the IR light. However, in another application, the light shielding rate of the light shielding layer 118 may indicate the light shielding degree of the UV light, the X-ray, or another radiation light having a shorter or longer wavelength.

After the patterned light shielding layer 118 is formed, a hardening process of the light shielding layer 118 may be further performed. For example, in one embodiment, the light shielding layer 118 may be hardened by using a heating process, irradiation process, or chemical reaction process. For example, in one embodiment, a heating process may be performed to the light shielding layer 118 to harden the light shielding layer 118. For example, the temperature of the light shielding layer 118 may be elevated to about 150° C. to about 250° C. and maintain the temperature for about 0.5~5 hours. In one embodiment, the heating process is disposing the light shielding layer 118 in an oven and baking at 200° C. for about 3 hours.

The light shielding layer 118 may assist in blocking and/or absorbing light coming from the outside of the chip package, especially light coming from behind the surface 100b of the substrate 100, thus facilitating operation of the optoelectronic device 102. For example, if the optoelectronic device 102 is an image sensor device, the light shielding layer 118 may block and/or absorb light coming from the surface 100b of the substrate 100 to prevent image noise from occurring. Alternatively, if the optoelectronic device 102 is a light emitting device, the light shielding layer 118 may block and/or absorb light coming from the surface 100*b* of the substrate 100 to prevent the wavelength and/or the intensity of light emitted by the chip package from being affected by external light. In the embodiments of the invention, because the light shielding layer 118 has an uniform thickness and does not have a portion that has a significantly smaller thickness as shown in FIG. 1B, the light shielding layer 118 is not easily affected by the profile of the material layer thereunder (such as the influence of the protection layer 115 and the filler 115*a*) and have voids or cracks. Thus, the external light coming from the outside of the chip package may be effectively blocked and/or absorbed.

Then, a conducting bump 120 may be disposed in the opening of the protection layer 115. In one embodiment, an under bump metallurgy layer (not shown) may be disposed between the conducting bump 120 and the conducting layer 116. In one embodiment, a solder material may be filled in the opening of the protection layer 115. Then, a reflow process may be performed to the solder material to form the conducting bump 120.

Figure 2E:
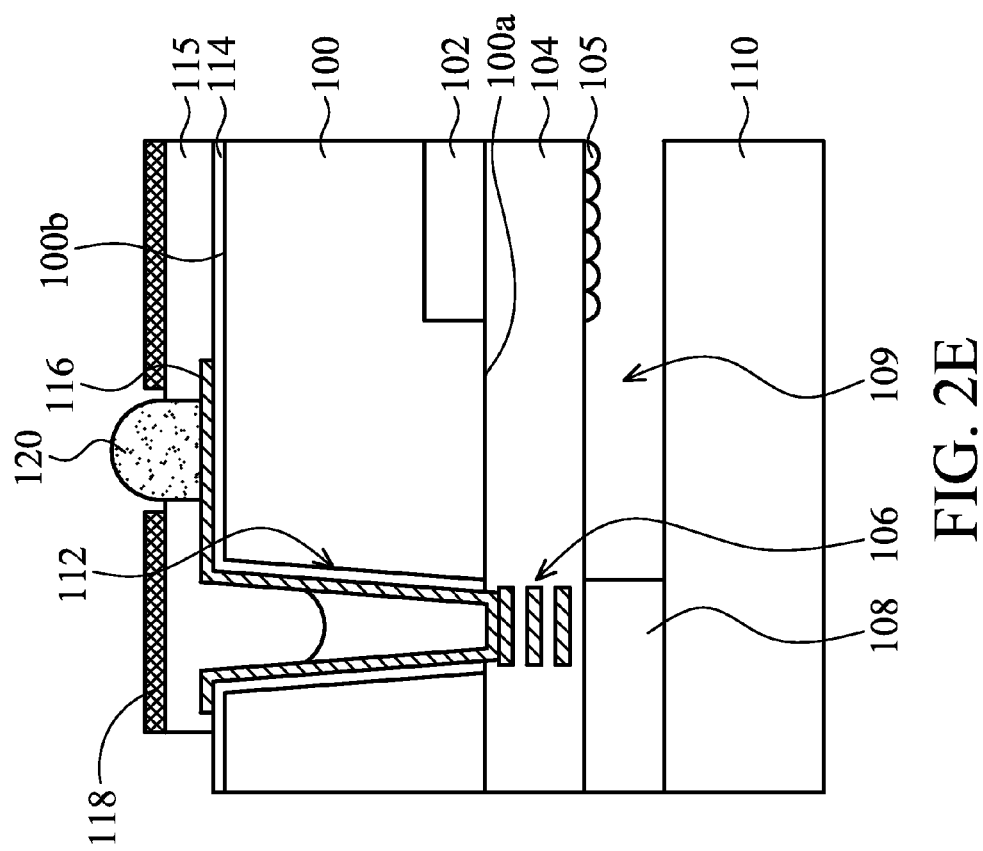

Next, a dicing process may be performed along the predetermined scribe lines SC to form a plurality of chip packages separated from each other, as shown in FIG. 2E. After the dicing process is performed, the substrate 100 is separated into a plurality of portions. Each of the portions of the substrate 100 may become the packaged chip in the formed chip package. Thus, the reference number "100" is also used to designate a chip.

Embodiments of the invention may have many variations. For example, in one embodiment, before the light shielding layer 118 is formed using the spraying process, the protection layer 115 may be optionally planarized to facilitate subsequent process steps. For example, the protection layer 115 may be planarized through a mechanical grinding process, chemical mechanical polishing process, or etching process. Thus, the subsequent process step for forming the light shielding layer 118 by using the spraying process is performed more satisfactorily.

Figure 3A:
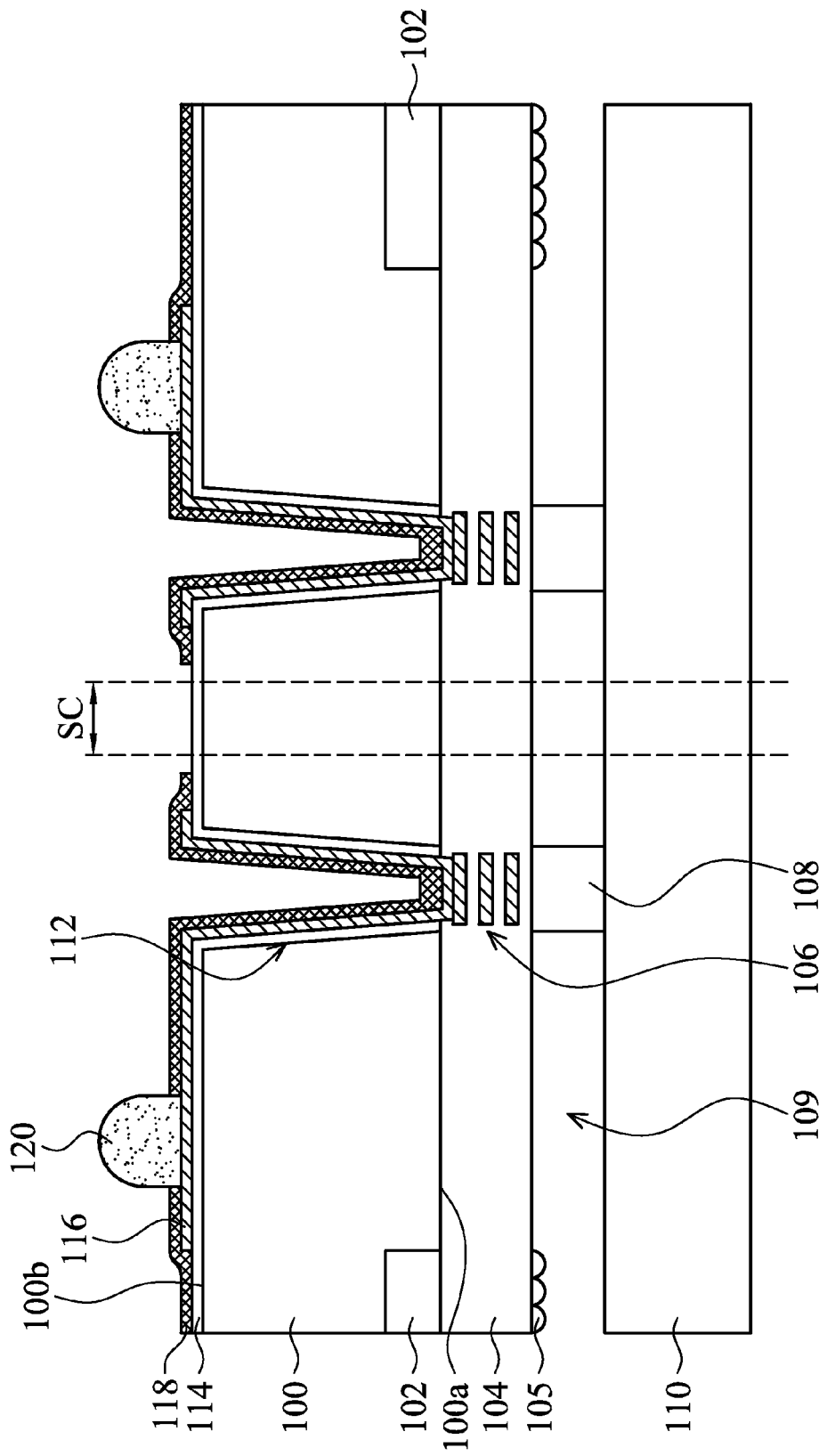
FIGS. 3A-3B are cross-sectional views showing the steps of forming a chip package according to an embodiment of the present invention.
Figure 3B:
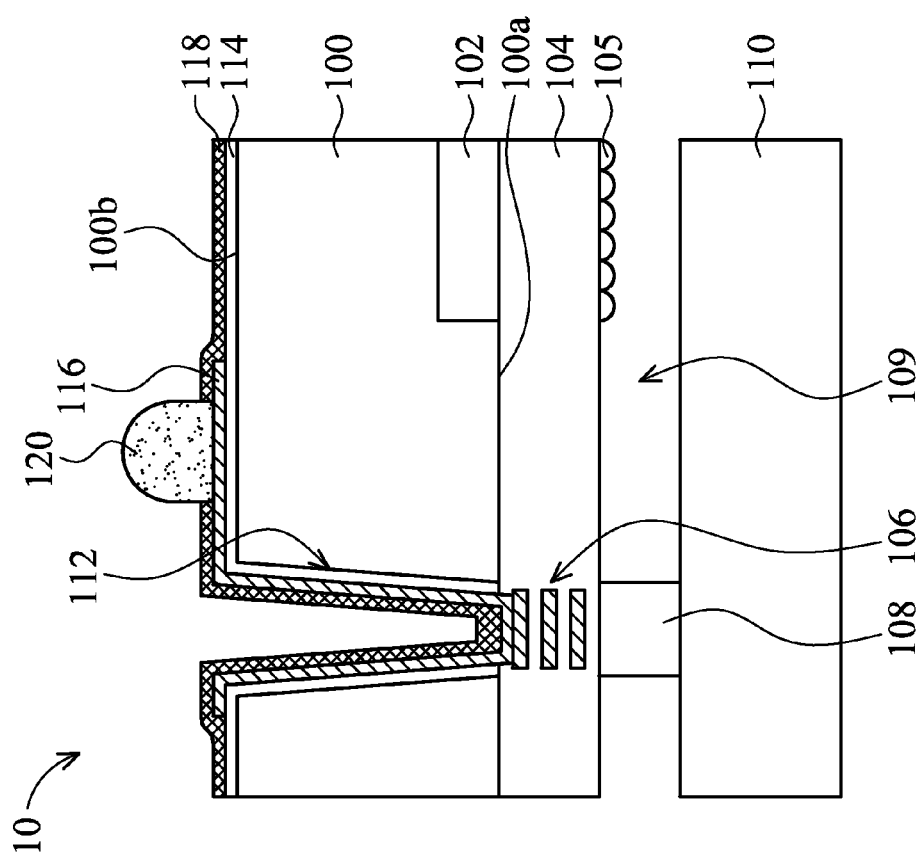

FIGS. 3A-3B are cross-sectional views showing the steps of forming a chip package according to another embodiment of the present invention, wherein same or similar reference numbers are used to designate same or similar elements. The embodiment shown in FIGS. 3A-3B is substantially similar to the embodiment shown in FIGS. 2A-2B, wherein the main difference is that the embodiment shown in FIGS. 3A-3B has no protection layer formed therein. In this embodiment, the light shielding layer 118 formed by using the spraying process may, for example, directly contact with the conducting layer 116 and the insulating layer 114. In this embodiment, the light shielding layer 118 may be used as a solder resist layer. In one embodiment, a solder material may be filled into the opening of the light shielding layer 118. Then, a reflow process may be performed to the solder material to form the conducting bump 120 on the conducting layer 116. In one embodiment, the light shielding layer 118 directly contacts with the conducting bump 120.

In the embodiments of the invention, the light shielding layer formed by using the spraying process may have a conformal profile and a substantially uniform thickness. The external light coming from the outside of the chip package may be effectively blocked and/or absorbed to ensure that the optoelectronic device in the chip package operates well.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
providing a substrate having a first surface and a second surface, wherein at least one optoelectronic device is formed in the substrate;
forming an insulating layer on the substrate;
forming a conducting layer on the insulating layer on the substrate, wherein the conducting layer is electrically connected to the at least one optoelectronic device;
spraying a solution of light shielding material on the second surface of the substrate to form a light shielding layer on the second surface of the substrate; and
forming a protection layer between the substrate and the light shielding layer, wherein the protection layer partially fills at least one through-hole extending from the second surface to the first surface of the substrate, and wherein a bottom surface of the protection layer does not reach a portion of the conducting layer which overlies a bottom of the at least one through-hole.

2. The method for forming a chip package as claimed in claim 1, further comprising patterning the light shielding layer.

3. The method for forming a chip package as claimed in claim 1, further comprising hardening the light shielding layer.

4. The method for forming a chip package as claimed in claim 3, wherein the step of hardening the light shielding layer comprises performing a heating process to the light shielding layer.

5. The method for forming a chip package as claimed in claim 1, further comprising planarizing the protection layer before the light shielding layer is formed.

6. The method for forming a chip package as claimed in claim 1, further comprising forming a conducting bump on the substrate, wherein the conducting bump penetrates through the protection layer and is electrically connected to the conducting layer.

7. The method for forming a chip package as claimed in claim 1, wherein the light shielding layer directly contacts with the protection layer.

8. The method for forming a chip package as claimed in claim 1, further comprising performing a dicing process along a plurality of predetermined scribe lines of the substrate to form a plurality of chip packages separated from each other.

9. The method for forming a chip package as claimed in claim 1, wherein the solution of light shielding material is sprayed from a nozzle.

10. The method for forming a chip package as claimed in claim 1, wherein the step of spraying the solution of light shielding material is performed in a chamber.

11. The method for forming a chip package as claimed in claim 10, further comprising introducing a gas flow into the chamber.

12. The method for forming a chip package as claimed in claim 1, further comprising forming a conducting bump on the substrate, wherein the conducting bump penetrates through the light shielding layer and is electrically connected to the conducting layer.

13. The method for forming a chip package as claimed in claim 1, further comprising removing a portion of the substrate from the second surface of the substrate to form the at least one through-hole extending towards the first surface, wherein the at least one through-hole exposes a conducting pad structure electrically connected to the at least one optoelectronic device, the insulating layer and the conducting layer extend into the through-hole, and the conducting layer is electrically connected to the conducting pad structure.

14. The method for forming a chip package as claimed in claim 13, further comprising thinning the substrate from the second surface of the substrate before the insulating layer is formed.

15. The method for forming a chip package as claimed in claim 1, further comprising disposing a transparent substrate on the first surface of the substrate.

16. The method for forming a chip package as claimed in claim 15, further comprising disposing at least one spacer layer between the substrate and the transparent substrate, wherein the substrate, the transparent substrate, and the at least one spacer layer surround a cavity on the optoelectronic device.

17. The method for forming a chip package as claimed in claim 1, wherein the thickness of the light shielding layer is substantially uniform.

18. A method for forming a chip package, comprising:
providing a substrate having a first surface and a second surface, wherein at least one optoelectronic device is formed in the substrate;
forming a through-hole extending from the second surface to the first surface;
forming an insulating layer on the substrate;
forming a conducting layer on the insulating layer on the substrate, wherein the conducting layer is electrically connected to the at least one optoelectronic device;
spraying a solution of light shielding material on the second surface of the substrate to form a light shielding layer on the second surface of the substrate; and
forming a protection layer between the substrate and the light shielding layer, wherein the protection layer partially fills the through-hole, and wherein a bottom surface of the protection layer does not reach a portion of the conducting layer which overlies a bottom of the through-hole.

19. The method for forming a chip package as claimed in claim 1, further comprising forming a conducting bump on the substrate, wherein the light shielding layer does not contact with the conducting bump and the protection layer contacts with the conducting bump.

* * * * *